(12) United States Patent
Hattori et al.

(10) Patent No.: US 10,492,303 B2
(45) Date of Patent: Nov. 26, 2019

(54) SUBSTRATE, ELECTRIC COMPRESSOR, AND AIR CONDITIONER

(71) Applicant: MITSUBISHI HEAVY INDUSTRIES THERMAL SYSTEMS, LTD., Tokyo (JP)

(72) Inventors: Makoto Hattori, Tokyo (JP); Hiroyuki Kamitani, Tokyo (JP); Hiroto Higuchi, Tokyo (JP); Takayuki Takashige, Tokyo (JP)

(73) Assignee: MITSUBISHI HEAVY INDUSTRIES THERMAL SYSTEMS, LTD., Tokyo (JP)

( * ) Notice: Subject to any disclaimer, the term of this patent is extended or adjusted under 35 U.S.C. 154(b) by 0 days.

(21) Appl. No.: 15/760,001

(22) PCT Filed: Sep. 5, 2016

(86) PCT No.: PCT/JP2016/075956
§ 371 (c)(1),
(2) Date: Mar. 14, 2018

(87) PCT Pub. No.: WO2017/056861
PCT Pub. Date: Apr. 6, 2017

(65) Prior Publication Data
US 2019/0053384 A1 Feb. 14, 2019

(30) Foreign Application Priority Data
Oct. 1, 2015 (JP) .................................. 2015-195983

(51) Int. Cl.
*H05K 3/34* (2006.01)
*B60H 1/32* (2006.01)
(Continued)

(52) U.S. Cl.
CPC ............. *H05K 3/34* (2013.01); *B60H 1/3222* (2013.01); *F04B 39/00* (2013.01); *H05K 1/18* (2013.01);
(Continued)

(58) Field of Classification Search
CPC ....... H05K 3/34; H05K 3/4644; B60H 1/3222
See application file for complete search history.

(56) References Cited

U.S. PATENT DOCUMENTS 4,487,654 A * 12/1984 Coppin ................ B23K 35/001
205/125
4,720,324 A * 1/1988 Hayward ............... H05K 3/062
205/166
(Continued)

FOREIGN PATENT DOCUMENTS

JP 2000-59016 A 2/2000
JP 2010-135622 A 6/2010
(Continued)

OTHER PUBLICATIONS

International Search Report dated Nov. 15, 2016 in Application No. PCT/JP2016/075956 with an English Translation.
(Continued)

*Primary Examiner* — William H. Mayo, III
*Assistant Examiner* — Hiram E Gonzalez
(74) *Attorney, Agent, or Firm* — Birch, Stewart, Kolasch & Birch, LLP

(57) ABSTRACT

A substrate includes a substrate body, a flux coating portion which is coated with flux promoting solder fluidity on a surface of the substrate body, a conduction portion which is disposed on the surface of the substrate body to be separated from the flux coating portion and is conductive, and a silk portion which is disposed between the flux coating portion
(Continued)

and the conduction portion on the surface of the substrate body and is provided by silk printing.

6 Claims, 2 Drawing Sheets

(51) Int. Cl.
    *H05K 1/18*         (2006.01)
    *H05K 3/46*         (2006.01)
    *F04B 39/00*       (2006.01)
    *B60R 16/02*       (2006.01)

(52) U.S. Cl.
    CPC ......... *H05K 3/3452* (2013.01); *H05K 3/3489* (2013.01); *H05K 3/4644* (2013.01); *B60H 2001/3292* (2013.01); *B60R 16/02* (2013.01); *H05K 2203/122* (2013.01)

(56) References Cited

U.S. PATENT DOCUMENTS

| | | | |
|---|---|---|---|
| 6,165,885 A * | 12/2000 | Gaynes | ................ B23K 1/0016 438/612 |
| 6,704,208 B2 * | 3/2004 | Kamiyama | ............ H05K 1/162 361/763 |
| 6,884,313 B2 * | 4/2005 | Liu | ........................... B32B 7/12 156/155 |
| 2006/0091553 A1 * | 5/2006 | Narizuka | ............ H01L 21/4853 257/762 |
| 2010/0142163 A1 | 6/2010 | Uemura et al. | |
| 2013/0241071 A1 * | 9/2013 | Hsieh | ...................... H01L 24/13 257/773 |

FOREIGN PATENT DOCUMENTS

| | | |
|---|---|---|
| JP | 2011-9603 A | 1/2011 |
| JP | 2014-110275 A | 6/2014 |
| JP | 2015-23040 A | 2/2015 |
| JP | 2015-149794 A | 8/2015 |

OTHER PUBLICATIONS

Written Opinion dated Nov. 15, 2016 in Application No. PCT/JP2016/075956 with an English Translation.

\* cited by examiner

SUBSTRATE, ELECTRIC COMPRESSOR, AND AIR CONDITIONER

TECHNICAL FIELD

The present invention relates to a substrate, an electric compressor, and an air conditioner.

Priority is claimed on Japanese Patent Application No. 2015-195983, filed on Oct. 1, 2015, the content of which is incorporated herein by reference.

BACKGROUND ART

For example, in a vehicle-mounted air conditioner, it is necessary to accommodate various components in a limited space in a vehicle, and high space-saving properties are required. Accordingly, in recent years, in order to increase the space-saving properties, an integrated electric compressor has been suggested in which a compressor, a motor for driving the compressor, and a circuit substrate for controlling the motor, which configure the vehicle-mounted air conditioner, are integrally configured. IGBT which is a switching element is mounted on the circuit substrate used in the integrated electric compressor.

In the circuit substrate, an element such as the IGBT is mounted on the substrate body by soldering. For example, Patent Document 1 discloses a printed wiring board in which a bonding stitch portion on a substrate and a plurality of bonding pads are connected by a bonding wire as the circuit substrate. Solder resist or silk is installed on this printed board so that contaminants such as organic solvents leached from soft solder such as solder paste do not flow out to the bonding stitch portion to be bonded.

CITATION LIST

Patent Literature

[Patent Document 1] Japanese Unexamined Patent Application, First Publication No. 2000-59016

SUMMARY OF INVENTION

Technical Problem

Meanwhile, in a case where an element is mounted on a substrate body by soldering, flux may be coated to improve solder fluidity. The flux has a very high fluidity, and thus, there is a possibility that the flux may flow out to a region other than a region to be coated.

For example, there is a possibility that the flux may flow out to a land formed around a fixing hole into which a screw fixing a circuit substrate to a housing of a compressor or the like is inserted. If the flux flows out to the land, conduction failures are caused by the flux. As a result, even when the circuit substrate and the housing are fixed to each other by the screw, there is a possibility that the circuit substrate and the housing cannot be electrically connected to each other.

The present invention provides a substrate, an electric compressor, and an air conditioner capable of suppressing conduction failures caused by flux.

Solution to Problem

In order to achieve the object, the present invention suggests the following means.

According to a first aspect of the present invention, there is provided a substrate including: a substrate body; a flux coating portion which is coated with flux promoting solder fluidity on a surface of the substrate body; a conduction portion which is disposed on the surface of the substrate body to be separated from the flux coating portion and is conductive; and a silk portion which is disposed between the flux coating portion and the conduction portion on the surface of the substrate body and is provided by silk printing.

According to a second aspect of the present invention, there is provided a substrate including: a substrate body; a flux coating portion which is coated with flux promoting solder fluidity on a surface of the substrate body; a conduction portion which is disposed on the surface of the substrate body to be separated from the flux coating portion and is conductive; a resist portion which is disposed between the flux coating portion and the conduction portion on the surface of the substrate body and is formed to be higher than the flux coating portion from the surface of the substrate body; and a silk portion which is disposed between the resist portion and the conduction portion and is provided by silk printing.

According to this configuration, a movement of the flux can be inhibited not only by the resist portion but also by the silk portion. Accordingly, it is possible to prevent the flux from flowing out from the flux coating portion to the conduction portion with high accuracy.

In the substrate according to a third aspect of the present invention, in the first or second aspect, the conduction portion may be disposed to surround the vicinity of a fixing hole which is formed in the substrate body such that a screw fixing a housing and the substrate body is inserted into the fixing hole.

According to this configuration, the conduction portion is disposed to surround the vicinity of the fixing hole, and thus, in a case where the substrate and the housing are fixed to each other by the screw, the screw is conducted via the conduction portion. The conduction failures of the conduction portion caused by the flux are suppressed, and thus, when the substrate body and the housing are fixed to each other by the screw, conduction can be stably secured.

In the substrate according to a fourth aspect of the present invention, in any one of the first to third aspects, the substrate may further include a base portion which is formed to be higher than the flux coating portion from the surface of the substrate body, in which the silk portion may be disposed on the base portion.

According to this configuration, the silk portion can be formed in a state where the silk portion protrudes from the surface of the substrate body by not only a thickness of an ink layer but also a height of the base portion. Accordingly, it is possible to further prevent the flux which crosses the resist portion to flow out to the silk portion from crossing the silk portion to flow out to the conduction portion.

According to a fifth aspect of the present invention, there is provided an electric compressor, including: the substrate according to any one of the first to fourth aspects; and a motor which is operated according to an AC current supplied from the substrate.

According to a sixth aspect of the present invention, there is provided an air conditioner, including: the electric compressor according to the fifth aspect, in which the air conditioner is mounted on a vehicle.

Advantageous Effects of Invention

According to the present invention, the flowing-out of the flux is suppressed by the silk portion, and thus, it is possible to suppress the conduction failures caused by the flux.

DESCRIPTION OF EMBODIMENTS

Hereinafter, a substrate according to an embodiment of the present invention will be described with reference to FIGS. 1 and 2.

An element having a large thermal capacity which is to be soldered by flux is mounted on a substrate (Printed Circuit Board (PCB)). For example, the substrate of the present embodiment is a power conversion circuit substrate 1 which is mounted on an electric compressor used in an air conditioner (car air-conditioner) mounted on a vehicle. The power conversion circuit substrate 1 is a circuit substrate which configures an inverter converting DC power supplied from the outside through an input terminal into three-phase AC power. Here, the power conversion circuit substrate 1 according to the present embodiment is integrally mounted on the electric compressor along with an AC motor which is operated according to the three-phase AC power output from the power conversion circuit substrate 1. The electric compressor (the power conversion circuit substrate 1) receives an input of DC power from a battery or the like mounted in the vehicle.

Figure 1:
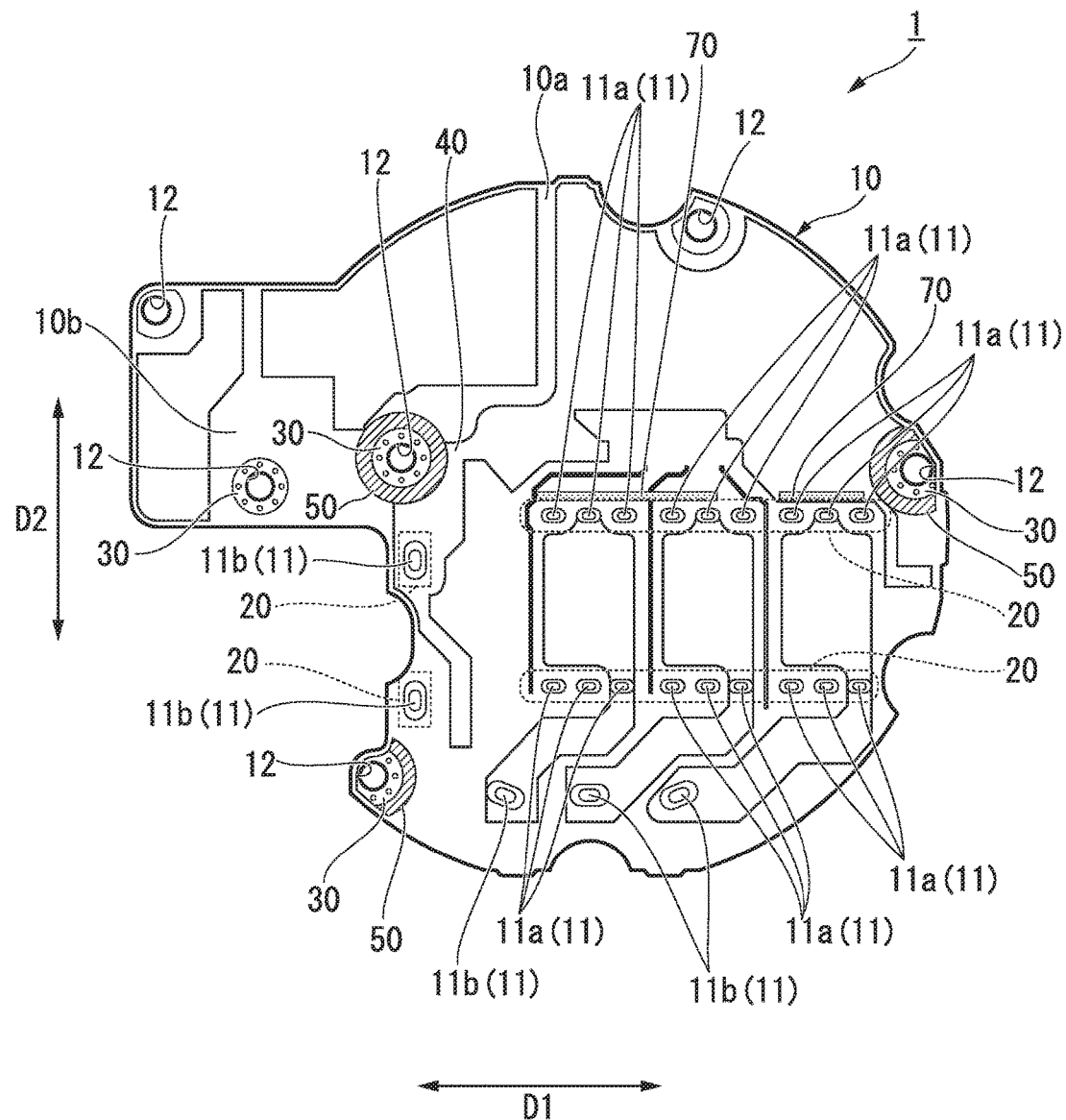
FIG. 1 is a schematic view showing a power conversion circuit substrate according to the present embodiment.

As shown in FIG. 1, the power conversion circuit substrate 1 of the present embodiment includes a substrate body 10, flux coating portions 20, conduction portions 30, a resist portion 40, a base portion 60, and silk portions 50.

The substrate body 10 is a printed substrate on which various circuit elements for configuring a power conversion circuit (inverter) for converting a DC to an AC are mounted. The substrate body 10 is formed in a flat plate shape. Here, in FIG. 1, a right-left direction on a paper surface is defined as a longitudinal direction D1 of the substrate body 10. In FIG. 1, an up-down direction on the paper surface is defined as a lateral direction D2 of the substrate body 10. Specifically, the substrate body 10 has a disk-shaped body portion 10a and a protrusion portion 10b protruding in a rectangular shape on one side (the left side on the paper surface in FIG. 1) of the body portion 10a in the lateral direction D2. The substrate body 10 has a pattern formed by a copper foil. Accordingly, in the substrate body 10, a high voltage circuit to which a high voltage is applied and a low voltage circuit to which a low voltage is applied are separately disposed.

In the substrate body 10, through-holes 11 for attaching the various elements such as a capacitor, a coil, or a switching element are formed.

The through-holes 11 are formed to penetrate the substrate body 10. According to locations where the elements are attached, a plurality of through-holes 11 are formed at positions at which lead portions (not shown) of the element can be inserted. Each of through-holes 11 of the present embodiment is a penetrating hole formed in an elliptical shape. In order to surround the vicinity of each of the through-holes 11, a land which is a ring-shaped conductor pattern is formed on the surface of the substrate body 10. That is, the land is provided on an edge of the through-hole 11. For example, the land is formed of a conductive member such as a copper foil. The through-holes 11 include first through-holes 11a through which the switching elements are attached and second through-holes 11b through which other elements such as capacitors are attached.

Here, the switching element is an element which switches between an ON state in which a current flows and an OFF state in which a current is interrupted, according to a drive signal (gate input) from the low voltage circuit. Two switching elements are provided for each of a U-phase, a V-phase and a W-phase forming a three-phase AC. In the substrate body 10 of the present embodiment, three switching elements arranged in the longitudinal direction D1 are mounted in two rows spaced apart in the lateral direction D2. The AC current of three phases (U phase, V phase, and W phase) is supplied to the AC motor by repeatedly turning the switching elements on and off at a timing defined by each switching element.

For example, in the present embodiment, as the switching element, an Insulated Gate Bipolar Transistor (IGBT) which is an element having a large thermal capacity is used. The switching element is soldered in a state where a plurality of pin-shaped lead portions are inserted into the first through-holes 11a, and thus, the switching element is mounted on the substrate body 10. Three lead portions are provided for each switching element.

Typically, the switching element is the IGBT. However, the switching element may be a bipolar transistor, a Metal-Oxide-Semiconductor Field Effect Transistor (MOSFET), or the like.

The first through-holes 11a of the present embodiment are formed in the vicinity of the center of the body portion 10a. In order to attach the switching element, in two rows separated from each other in the lateral direction D2, the first through-holes 11a are formed at nine locations in the longitudinal direction D1 for each row.

The second through-holes 11b of the present embodiment are formed at positions away from the plurality of first through-holes 11a in the body portion 10a.

In the substrate body 10, fixing holes 12 through which screws are inserted when the substrate body 10 is fixed to the housing of an electric compressor (not shown) are formed. The fixing holes 12 are formed in a circular shape and extend to penetrate the substrate body 10. A plurality of fixing holes 12 are provided to be separated from each other along an outer periphery of the substrate body 10. The substrate body 10 is screwed to the housing of the electric compressor via the fixing holes 12.

Each of the flux coating portions 20 is an area which is coated with flux to promote solder fluidity on the surface of the substrate body 10. The flux coating portion 20 of the present embodiment is provided on the ring-shaped land surrounding the through-hole 11 and in the vicinity of the land. That is, the flux coating portion 20 is a certain area in the vicinity of the through-hole 11 including through-hole 11. The flux coating portion 20 is coated with the flux, and thus, a height of the flux coating portion 20 is approximately the same as that of the surface of the substrate body 10. The flux coating portions 20 of the present embodiment are formed to surround the plurality of first through-holes 11a together. The flux coating portions 20 are formed to surround the second through-holes 11b one by one.

The conduction portions 30 are formed of a conductive member. Each of the conduction portions 30 is formed in a ring shape to surround the fixing hole 12. That is, the conduction portion 30 of the present embodiment is provided on the edge of the fixing hole 12 as a ground land which is connected to a ground line. For example, the conduction portion 30 is formed of a conductive member such as a copper foil. The screws are inserted into the fixing holes 12 and the substrate body 10 is fixed. Accordingly, the conduction portion 30 provided on the edge of the fixing hole 12 and a head portion of the screw come into contact with each other, and thus, the power conversion circuit substrate 1 is conducted.

The resist portion 40 covers a part of the surface of the substrate body 10. The resist portion 40 is an insulating layer which protects a region, in which a circuit pattern is formed by a copper foil inside the resist portion 40. As shown in FIG. 2, the resist portion 40 of the present embodiment is disposed between the flux coating portion 20 and the conduction portion 30 on the surface of the basic body. The resist portion 40 is formed to be higher than the flux coating portion 20 or the conduction portion 30 from the surface of the substrate body 10. That is, in the resist portion 40, a resist is applied to the surface of the substrate body 10, and thus, the resist portion 40 protrudes from the surface of the substrate body 10 by a thickness of a layer of the resistor.

As shown in FIG. 1, the base portion 60 is disposed between the resist portion and the conduction portion 30. As shown in FIG. 2, the base portion 60 is formed to be higher than the flux coating portion 20 or the conduction portion 30 from the surface of the substrate body 10. The base portion 60 of the present embodiment is formed to be higher than the flux coating portion 20 or the conduction portion 30 from the surface of the substrate body 10. The base portion 60 is formed to be lower than the resist portion 40 from the surface of the substrate body 10. The base portion 60 may be configured of the same material as that of the resist portion 40.

As shown in FIG. 1, the silk portion 50 is disposed between the resist portion and the conduction portion 30. The silk portion 50 is provided by performing silk printing on the substrate body 10. Accordingly, the silk portion 50 is formed to be thicker by a thickness of a layer formed of ink. As shown in FIG. 2, the silk portion 50 is formed to be higher than the flux coating portion 20 or the conduction portion 30 from the surface of the substrate body 10. The silk portion 50 of the present embodiment is formed by performing silk printing on the base portion 60. Accordingly, in the silk portion 50 of the present embodiment, a height from the surface of the substrate body 10 to the surface of the silk portion 50 is set to be approximately the same as a height from the surface of the substrate body 10 to the surface of the resist-attached land.

The silk portion 50 of the present embodiment is provided to be adjacent to the outer periphery of the conduction portion 30 to surround the conduction portion 30. A portion of the silk portion 50 disposed at a position close to the flux coating portion 20 is adjacent not only to the conduction portion 30 but also to the resist portion 40.

In the power conversion circuit substrate 1, similarly to the silk portion 50, IGBT silk portions 70 provided by silk printing are formed. The IGBT silk portions 70 are formed at positions separated from the first through-holes 11a in the lateral direction D2. Each of the IGBT silk portions 70 extends in a linear shape in the longitudinal direction D1 so as to be disposed parallel to the plurality of first through-holes 11a.

According to the above-described substrate, the resist portion 40 and the silk portion 50 are provided between the flux coating portion 20 and the conduction portion 30. Accordingly, the movement of the flux coating the flux coating portion 20 can be inhibited not only by the resist portion 40 but also by the silk portion 50. Specifically, the resist portion 40 is formed to be higher than the flux coating portion 20. Accordingly, the flux does not flow out from the flux coating portion 20 to the silk portion 50 unless the flux does not cross the resist portion 40. Therefore, it is possible to prevent the flux from flowing out to the silk portion 50. In addition, the silk portion 50 is provided between the resist portion 40 and the conduction portion 30. Accordingly, even if the flux crosses the resist portion 40 and flows out, it is possible to prevent the flux from flowing out to the conduction portion 30 by the silk portion 50 which is formed to be higher by the thickness of the layer of the ink from the surface of the substrate body 10. Accordingly, it is possible to prevent the flux from flowing out from the flux coating portion 20 to the conduction portion 30 with high accuracy. Therefore, the movement of the flux is inhibited by the resist-attached land and the silk portion 50, and it is possible to suppress the conduction failures of the conduction portion 30 caused by the flux.

The conduction portion 30 is disposed to surround the vicinity of the fixing hole 12. Accordingly, in a case where the substrate body 10 and the housing are fixed to each other by screws, the screws are conducted via the conduction portions 30. The conduction failures of the conduction portions 30 caused by the flux are suppressed, and thus, it is possible to stably secure the conduction of the power conversion circuit substrate 1 when the screws are fixed.

Each silk portion 50 is formed on the base portion 60 by the silk printing. Accordingly, the silk portion 50 can protrude from the surface of the substrate body 10 by not only the height of the layer of the ink but also the height of the base portion 60. Accordingly, it is possible to further prevent the flux which crosses the resist portion 40 to flow out to the silk portion 50 from crossing the silk portion 50 to flow out to the conduction portion 30.

Particularly, in the present embodiment, the height from the surface of the substrate body 10 to the surface of the silk portion 50 is set to be approximately the same as the height from the surface of the substrate body 10 to the surface of the resist-attached land. Accordingly, it is possible to further prevent the flux which crosses the resist portion 40 to flow out to the silk portion 50 from crossing the silk portion 50 to flow out to the conduction portion 30.

Hereinbefore, the embodiment of the present invention is described in detail with reference to the drawings. However, the configurations and combinations thereof in the embodiment are merely examples, and additions, omissions, replacements, and other modifications of configurations can be applied within the scope which does not depart from the gist of the present invention. In addition, the present invention is not limited to the embodiment and is limited by only the claims.

Moreover, the substrate manufactured by the present embodiment is the power conversion circuit substrate 1. However, the present invention is not limited to this. The substrate may be any substrate as long as it is a substrate on which an element having a large thermal capacity is mounted by soldering using the flux.

As the element having a large thermal capacity, the IGBT is described as an example. However, the present invention is not limited to this. The element may be any element as long as it is an element such as a capacitor or a coil having a large thermal capacity mounted by soldering.

Figure 2:
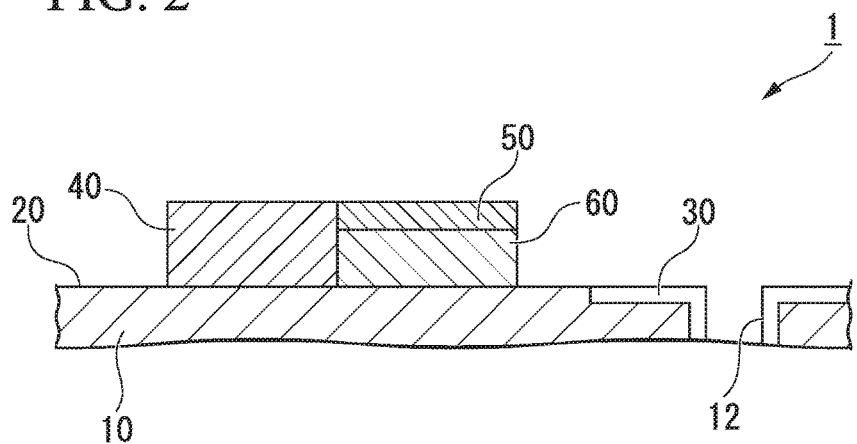
FIG. 2 is a sectional view of a main portion showing a cross section of the power conversion circuit substrate according to the present embodiment.
Figure 3:
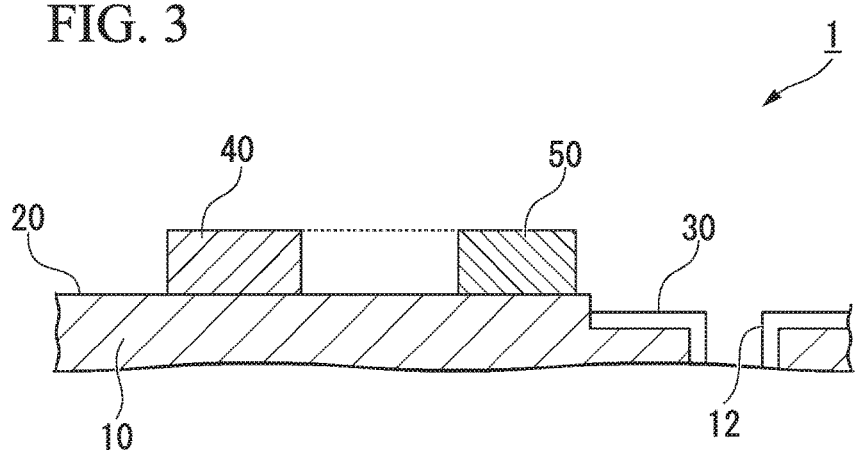
FIG. 3 is a sectional view of a main portion showing a cross section of a power conversion circuit substrate according to a modification example of the present embodiment.

As shown in FIG. 2, the silk portion 50 is formed to be arranged with the resist portion 40. However, the present invention is not limited to this disposition. That is, the silk portion 50 may be disposed between the resist portion and the conduction portion 30. Accordingly, as shown in a modification example of the present invention of FIG. 3, the silk portion 50 may be disposed with a clearance between the silk portion 50 and the resist portion 40 such that a gap is formed between the silk portion 50 and the resist portion 40. In addition, the base portion 60 is not provided, and the silk portion 50 may be formed by directly performing silk printing on the substrate body 10. In this case, preferably, the silk portion 50 is formed in a state where the silk portion 50 protrudes from the surface of the substrate body 10 to the height which is approximately the same as that of the resist portion 40, depending on the thickness of the layer of the ink.

The power conversion circuit substrate 1 may be configured such that the silk portions 50 are disposed singly. That is, in the power conversion circuit substrate 1, it is not necessary to dispose the resist portion 40, the base portion 60, or the like. In this case, in the power conversion circuit substrate 1, the silk portion 50 is disposed to protect a region to be a coating prohibition area for a coating agent such as the flux.

INDUSTRIAL APPLICABILITY

According to the substrate, it is possible to suppress the conduction failures caused by the flux.

REFERENCE SIGNS LIST

1: power conversion circuit substrate
10: substrate body
10a: body portion
10b: protrusion portion
11: through-hole
11a: first through-hole
11b: second through-hole
12: fixing hole
20: flux coating portion
30: conduction portion
40: resist portion
50: silk portion
60: base portion
70: IGBT silk portion
D1: longitudinal direction
D2: lateral direction

What is claimed is:

1. A substrate comprising:
a substrate body;
a flux coating portion which is coated with flux promoting solder fluidity on a surface of the substrate body;
a conduction portion which is disposed on the surface of the substrate body to be separated from the flux coating portion and is conductive;
a resist portion which is disposed between the flux coating portion and the conduction portion on the surface of the substrate body and is formed to be higher than the flux coating portion and the conduction portion from the surface of the substrate body; and
a silk portion which is disposed between the resist portion and the conduction portion and is provided by silk printing.

2. The substrate according to claim 1,
wherein the conduction portion is disposed to surround the vicinity of a fixing hole which is formed in the substrate body such that a screw fixing a housing and the substrate body is inserted into the fixing hole.

3. The substrate according to claim 1, further comprising:
a base portion which is formed to be higher than the flux coating portion and the conduction portion from the substrate body,
wherein the silk portion is disposed on the base portion.

4. An electric compressor, comprising:
the substrate according to claim 1; and
a motor which is operated according to an AC current supplied from the substrate.

5. An air conditioner, comprising:
the electric compressor according to claim 4,
wherein the air conditioner is mounted on a vehicle.

6. The substrate according to claim 1,
Wherein the silk portion is disposed with a clearance between the silk portion and the resist portion.

* * * * *